(12) United States Patent
Saitou et al.

(10) Patent No.: US 8,076,827 B2
(45) Date of Patent: Dec. 13, 2011

(54) ACOUSTIC WAVE DEVICE AND METHOD FOR FABRICATING THE SAME

(75) Inventors: Yasuyuki Saitou, Yokohama (JP);
Osamu Kawachi, Yokohama (JP);
Kaoru Sakinada, Yokohama (JP);
Yasuyuki Oda, Yokohama (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 66 days.

(21) Appl. No.: 12/560,059

(22) Filed: Sep. 15, 2009

(65) Prior Publication Data
US 2010/0066209 A1 Mar. 18, 2010

(30) Foreign Application Priority Data
Sep. 17, 2008 (JP) .................. 2008-238482

(51) Int. Cl.
*H01L 41/053* (2006.01)
(52) U.S. Cl. .............. 310/344; 310/340; 310/348
(58) Field of Classification Search ........... 310/340, 310/344, 348
See application file for complete search history.

(56) References Cited

U.S. PATENT DOCUMENTS

| | | | | |
|---|---|---|---|---|
| 7,357,017 | B2 * | 4/2008 | Felton et al. | 73/104 |
| 7,388,281 | B2 * | 6/2008 | Krueger et al. | 257/678 |
| 7,474,175 | B2 * | 1/2009 | Furihata et al. | 333/193 |
| 7,752,747 | B2 * | 7/2010 | Higuchi et al. | 29/832 |
| 2005/0242420 | A1 * | 11/2005 | Matsuda et al. | 257/684 |
| 2005/0285700 | A1 * | 12/2005 | Koga et al. | 333/133 |
| 2006/0138672 | A1 | 6/2006 | Sakinada et al. | |
| 2007/0008051 | A1 * | 1/2007 | Tsuda et al. | 333/193 |
| 2007/0107177 | A1 * | 5/2007 | Kawachi et al. | 29/25.35 |
| 2007/0222056 | A1 * | 9/2007 | Bauer et al. | 257/687 |
| 2008/0111247 | A1 * | 5/2008 | Sakinada et al. | 257/778 |

FOREIGN PATENT DOCUMENTS

JP 2006-203149 A 8/2006

* cited by examiner

*Primary Examiner* — Thomas Dougherty
(74) *Attorney, Agent, or Firm* — Chen Yoshimura LLP

(57) ABSTRACT

An acoustic wave device includes a substrate, a device chip that has a piezoelectric substrate and is flip-chip mounted on a surface of the substrate, a first insulation layer that has a dielectric constant lower than that of the piezoelectric substrate and is provided on a surface of the device chip opposite to another surface that faces the substrate, and a metal seal part that seals the device chip.

15 Claims, 20 Drawing Sheets

1ST EMBODIMENT ———
RELATED ART - - - - -

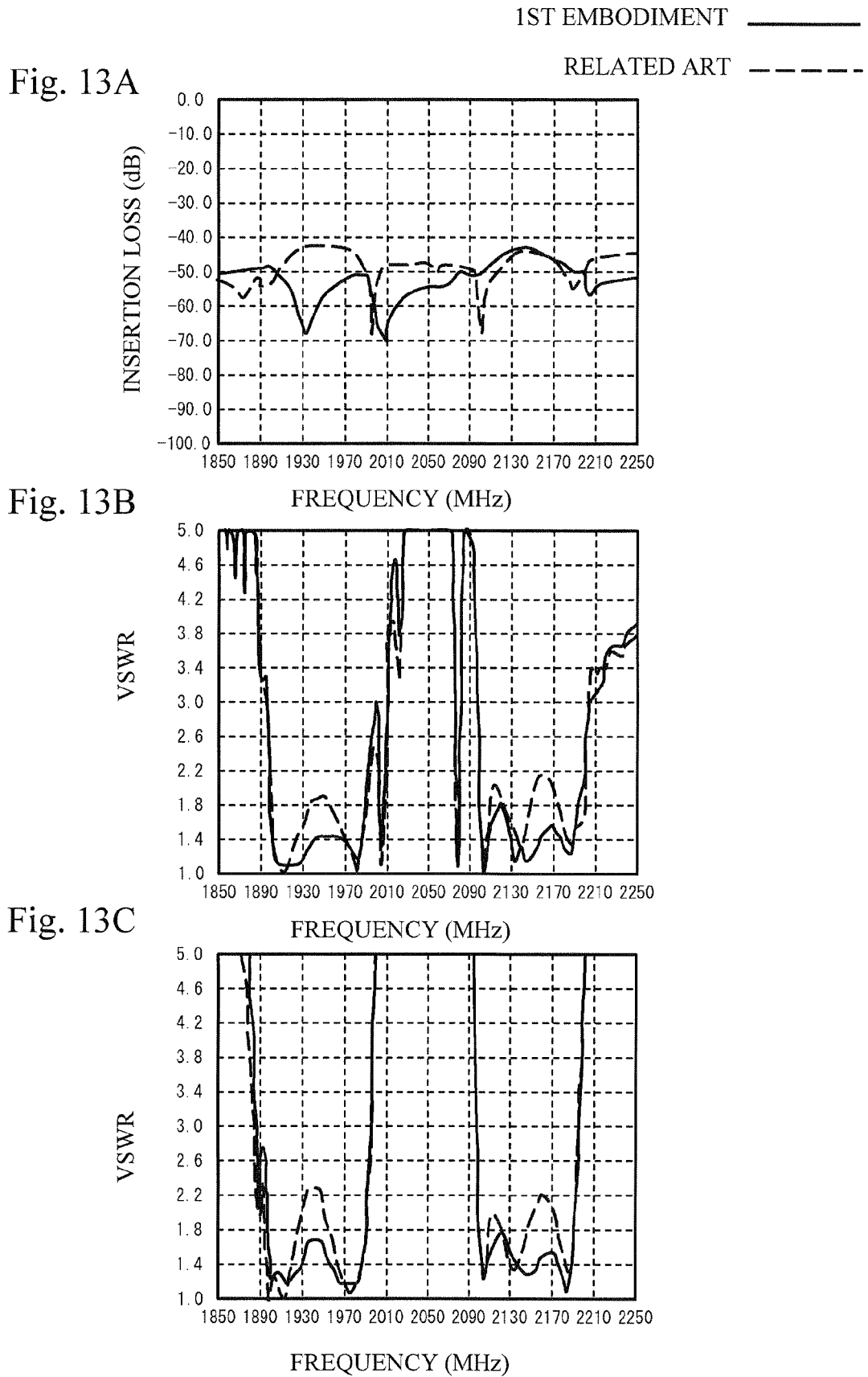

3RD EMBODIMENT ———
RELATED ART – – – –

3RD EMBODIMENT ———
RELATED ART - - - - - -

ACOUSTIC WAVE DEVICE AND METHOD FOR FABRICATING THE SAME

CROSS-REFERENCE TO RELATED APPLICATION

This application is based upon and claims the benefit of priority of the prior Japanese Patent Application No. 2008-238482, filed on Sep. 17, 2008, the entire contents of which are incorporated herein by reference.

FIELD

A certain aspect of the embodiments discussed herein is related to an acoustic wave device and a method for fabricating the same.

BACKGROUND

Recently, there has been a demand for downsizing and cost reduction of electronic devices. Flip-chip mounting may meet such a demand. In flip-chip mounting, a device chip is mounted on a substrate using bumps. An electronic device equipped with a device chip is designed to seal the device chip in order to protect the device chip from temperature change and shock. Particularly, in a case where the device chip is a surface acoustic wave (SAW) filter or a film bulk acoustic resonator (FRAR), which may be used as a bandpass filter or a duplexer, a deposit that enters in the device chip may change the frequency characteristic of the device chip.

Japanese Laid-Open Patent Publication No. 2006-203149 discloses an art in which a device chip is flip-chip mounted on a package substrate and is sealed with a member made of solder.

SUMMARY

According to an aspect of the present invention, there is provided an acoustic wave device including: a substrate; a device chip that has a piezoelectric substrate and is flip-chip mounted on a surface of the substrate; a first insulation layer that has a dielectric constant lower than that of the piezoelectric substrate and is provided on a surface of the device chip opposite to another surface that faces the substrate; and a metal seal part that seals the device chip.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 13A is a graph of results of simulation of isolation characteristics of the related art and the first embodiment, FIG. 13B is a graph of results of simulation of VSWR at an antenna, and FIG. 13C is a graph of results of simulation of VSWRs at a transmission terminal and a reception terminal;

DESCRIPTION OF EMBODIMENTS

First, a description will be given of an acoustic wave device related to an aspect of an embodiment of the present invention with reference to FIG. 1, which is a cross-sectional view of such an acoustic wave device.

Figure 1:
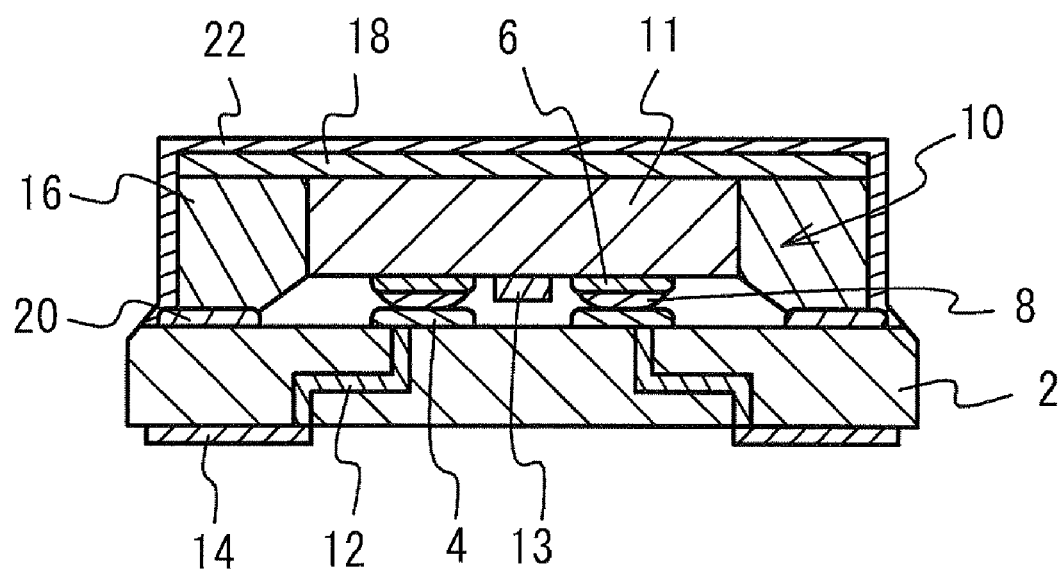
FIG. 1 is a cross-sectional view of an acoustic wave device related to an aspect of an embodiment.

Referring to FIG. 1, a device chip 10 is flip-chip mounted on an upper surface of a substrate 2, which may be made of an insulative material such as ceramic. The device chip 10 has a piezoelectric substrate 11 and an electrode pattern 13. The piezoelectric substrate 11 may be made of, for example, lithium niobate (LiNbO$_3$) or lithium tantalate (LiTaO$_3$). The electrode pattern 13 may be made of a metal such as aluminum. Terminals 4 provided on an upper surface of the substrate 2 and terminals 6 provided on a surface of the device chip 10 facing the above upper surface are connected by bumps 8 made of a metal such as gold. The terminals 4 may be made of a metal, which may have a layer structure such W/Ni/Au or Mo/Ni/Au. The terminals 6 may be made of a metal such as Al, Au or Cu. The terminals 4 provided on the upper surface of the substrate 2 are electrically connected to external terminals 14 provided on a lower surface of the substrate 2 by via interconnections 12. The external terminals 14 may be made of a metal such as W/Ni/Au or Mo/Ni/Au. The via interconnections 12 may be made of a metal such as W or Al. The device chip 10 is sealed with a metal seal part 16 and a lid 18. The metal seal part 16 may be made of solder such as Sn—Ag. The lid 18 may be made of, for example, an alloy of Fe, Ni and cobalt, namely, Koval. A metal pattern 20, which may be made of a metal such as W/Ni/Au or Mo/Ni/Au, is provided on the upper surface of the substrate 2. The metal pattern 20 is connected to the metal seal part 16. The metal seal part 16 and the lid 18 are covered with a protection film 22, which may be made of a metal such as Ni.

The acoustic wave device thus configured hermetically seals the device chip 10 and makes it possible to realize downsizing, thinning and cost reduction.

However, there is a possibility that an electric field leaks from the piezoelectric substrate 11 in a case where the device chip 10 is a SAW device or an FBAR equipped with the piezoelectric substrate 11. This leakage of the electric field may be caused when the metal seal part 16 made of solder touches the piezoelectric substrate 11 because the piezoelectric substrate 11 has a higher dielectric constant than the substrate 2. The leakage of the electric field may cause signals to leak to the external terminals 14 from ground terminals, and may increase the insertion loss in the pass band of the device chip 10 and may degrade the isolation.

According to an aspect of an embodiment, it is possible to provide an acoustic wave device that is equipped with a highly reliable hermetic seal and is capable of suppressing increase in the insertion loss in the pass band and degradation of isolation and to provide a method for fabricating such an acoustic wave device.

First Embodiment

Figure 2:
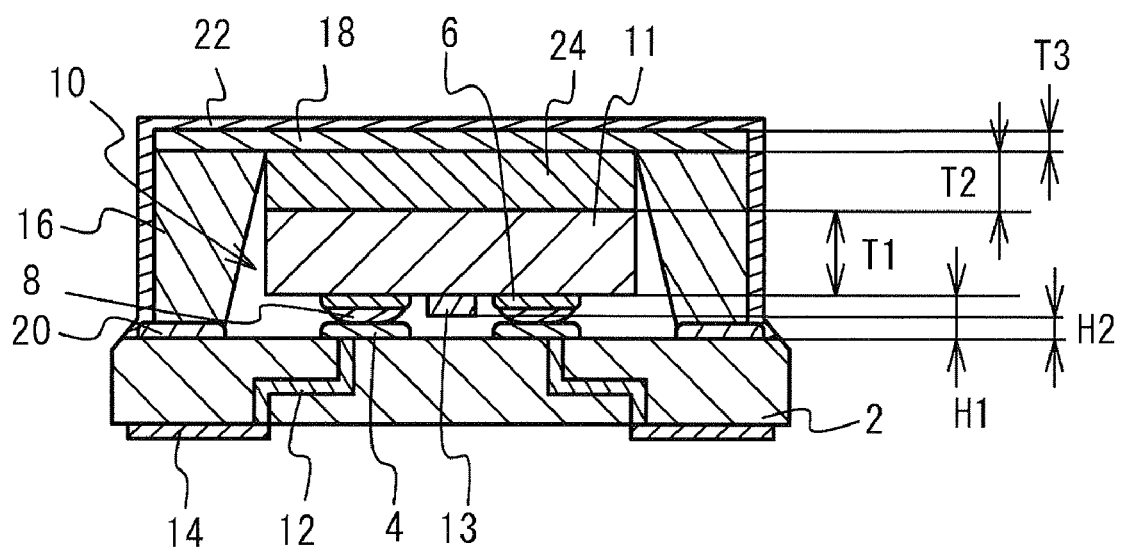
FIG. 2 is a cross-sectional view of an acoustic wave device in accordance with a first embodiment.

FIG. 2 is a cross-sectional view of an acoustic wave device in accordance with a first embodiment, in which parts that are the same as those illustrated in FIG. 1 are given the same reference numerals as previously.

Referring to FIG. 2, the device chip 10, which may be a SAW device chip, is flip-chip mounted on the substrate 2 made of an insulative material, which may be ceramic such as alumina. The device chip 10 has the piezoelectric substrate 11 made of, for example, LiNbO$_3$ or LiTaO$_3$, and the electrode pattern 13 such as an interdigital transducer (IDT). A first insulation layer 24 is provided on a surface of the device chip 10 opposite to another surface that faces the substrate 2. The first insulation layer 24 may be made of an insulator such as epoxy resin. The first insulation layer 24 has a dielectric constant lower than that of the piezoelectric substrate 11. The device chip 10 and the first insulation layer 24 are sealed with the metal seal part 16 made of solder such as Sn—Ag, and the lid 18 made of Koval. The metal seal part 16 does not touch the side surfaces of the device chip 10.

Figure 3A:
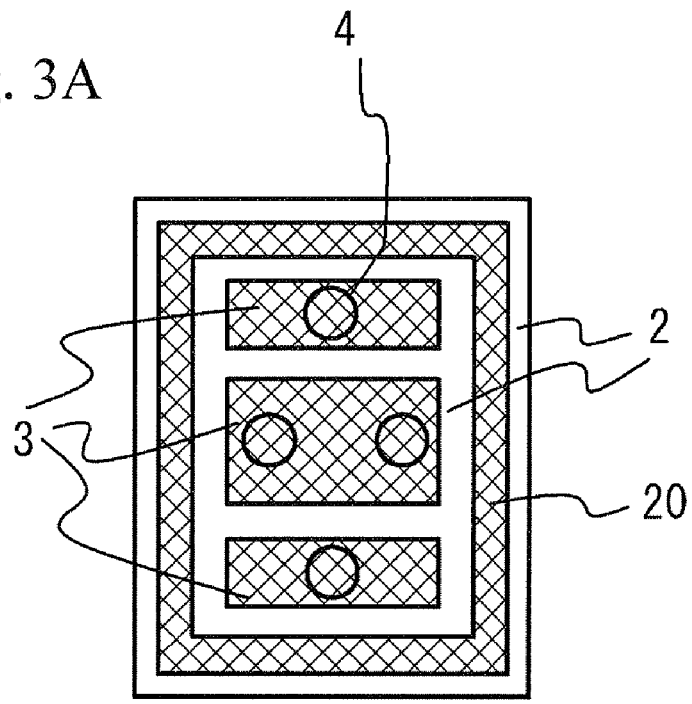
FIG. 3A is a plan view of a substrate observed before a device chip is mounted.
Figure 3B:
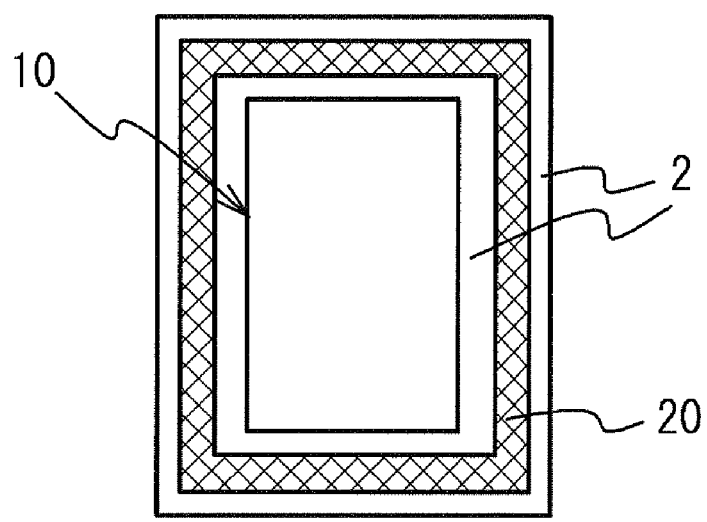
FIG. 3B is a plan view of the substrate observed after a device chip is mounted.

FIG. 3A is a plan view of the substrate 2 observed before the device chip 10 is mounted thereon, and FIG. 3B is a plan view of the substrate observed after the device chip 10 is mounted.

As depicted in FIG. 3A, interconnection patters 3 are formed on the upper surface of the substrate 2, and are provided with the terminals 4 which function as input, output or ground terminals. The device chip 10 is mounted on the substrate 2, and an interconnection pattern 3 is connected to the device chip 10 via the terminals 4 and the bumps 8. The metal pattern 20 connected to the metal seal part 16 and composed of a multilayer such as W/Ni/Au or Mo/Ni/Au is provided on the upper surface of the substrate 2 and is located further out than the interconnection pattern 3.

As illustrated in FIG. 3B, after the device chip 10 is mounted, the metal pattern 20 is located outside of a region in which the device chip 10 and the substrate 2 overlap each other. It is thus possible to ensure the distance between the metal seal part 16 connected to the metal pattern 20 and the device chip 10 and to prevent the metal seal part 16 from touching the side surfaces of the device chip 10. The metal pattern 20 may be made of another metal having good solder wetness other than W/Ni/Au or Mo/Ni/Au.

Figure 4A:
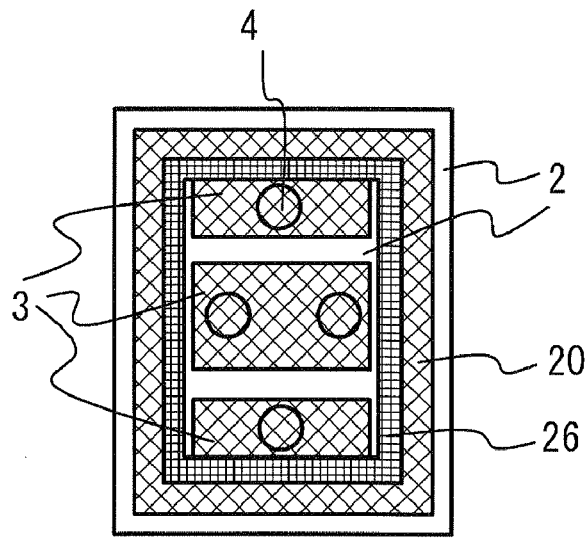
FIGS. 4A and 4B are plan views of a substrate observed before a device chip is mounted.
Figure 4B:
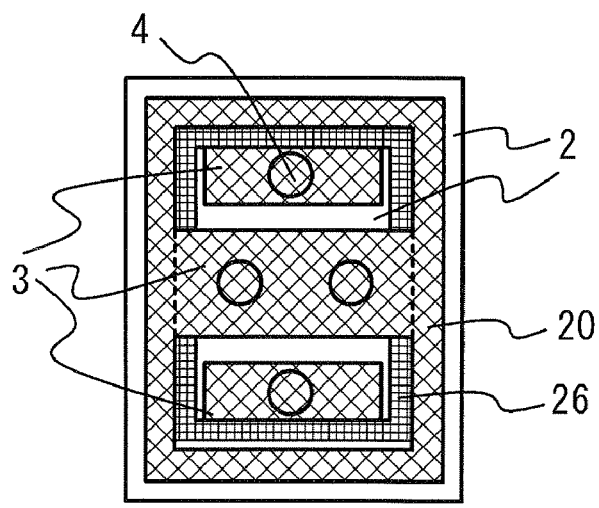
Figure 4C:
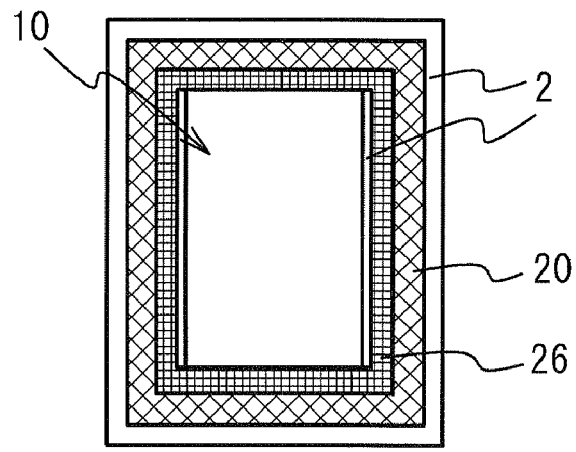
FIG. 4C is a plan view of the substrate observed after the device chip is mounted.

A description will now be given, with reference to FIGS. 4A through 4C, of an acoustic wave device in accordance with a variation of the first embodiment. FIGS. 4A and 4B are plan views of the substrate 2 observed before the device chip 10 is mounted thereon, and FIG. 4C is a plan view of the substrate 2 observed after the device chip 10 is mounted. In FIG. 4B, a part of a second insulation layer 26 is seen through.

As illustrated in FIG. 4A, the second insulation layer 26, which may be made of an insulator such as glass, is provided on the upper surface of the substrate 2 and is interposed between the interconnection pattern 3 and the metal pattern 20. As illustrated in FIG. 4C, after the device chip 10 is mounted, the second insulation layer 26 on the upper surface of the substrate 20 is located between the metal pattern 20 and the overlapping region in which the device chip 10 overlaps the substrate 2. The solder wetness of the second insulation layer 26 is worse than that of the metal pattern 20. It is thus possible to reliably prevent the metal seal part 16 made of solder from touching the side surfaces of the device chip 10. The second insulation layer 26 may be formed on the upper surface of the substrate 2 by glass coating.

In the exemplary structure illustrated in FIG. 4B, a part of the interconnection pattern 3 on which ground terminals are provided are connected to the metal pattern 20. The second insulation layer 26 is provided so as to overlap a part of the interconnection pattern 3. In other words, the second insulation layer 26 is provided to at least a part of the section or area between the metal pattern 20 and the overlapping region in which the device chip 10 overlaps the substrate 2 and is arranged so as to overlap with a part of the interconnection pattern 3. It is thus possible to reduce the number of via interconnections 12 (see FIG. 2).

A description will now be given of a method for fabricating the acoustic wave device in accordance with the first embodiment. FIGS. 5A through 5E, FIGS. 6A through 6D, and FIGS. 7A and 7B are cross-sectional views illustrating the method for fabricating the acoustic wave device in accordance with the first embodiment. In these figures, the terminals 4 and 6, the via interconnections 12, the external terminals 14 and the metal pattern 20 are omitted for the sake of simplicity.

Figure 5A:
FIGS. 5A through 5E are cross-sectional views illustrating a method for fabricating the acoustic wave device in accordance with the first embodiment.
Figure 5B:

Referring to FIG. 5A, a piezoelectric substrate 28 of panel type is prepared. Next, as illustrated in FIG. 5B, a first insulation layer 30 made of an insulator such as epoxy resin is provided on an upper surface of the piezoelectric substrate 28, which is opposite to another surface that faces the substrate 2 after flip-chip mounting. The first insulation layer 30 may be formed by coating the piezoelectric substrate 28 with epoxy in liquid form or applying epoxy in sheet form to the piezoelectric substrate 28. In a case where the first insulation layer 30 is made of ceramic such as alumina, a ceramic layer is applied to the piezoelectric substrate 28. In the example illustrated in FIGS. 5A and 5B, the step of forming the first insulation layer 30 is carried out prior to flip-chip mounting.

Figure 5C:
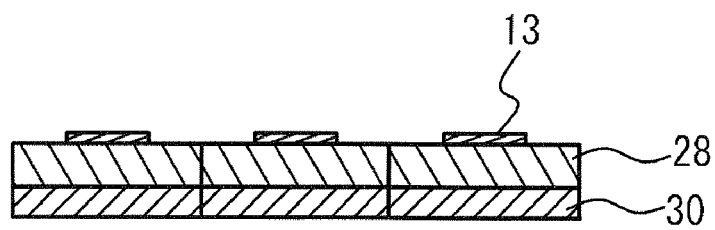

As depicted in FIG. 5C, after the first insulation layer 30 is formed, the electrode pattern 13, which may be an IDT made of a metal such as Al, is formed on the surface of the piezoelectric substrate 28 opposite to the surface on which the first insulation layer 30 is provided.

Figure 5D:
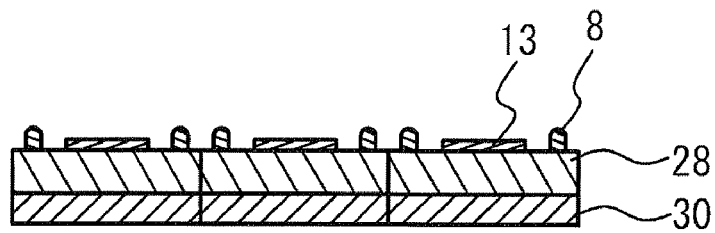
Figure 5E:
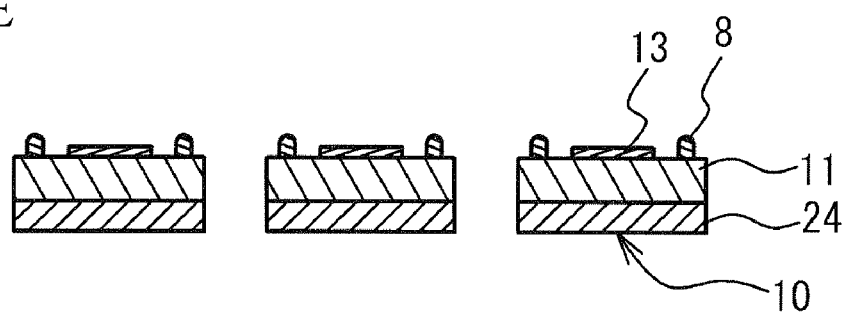

As illustrated in FIG. 5D, the bumps 8 made of a metal such as Au are formed on the surface of the piezoelectric substrate 28 on which the electrode pattern 13 is formed. As illustrated in FIG. 5E, dicing is performed to separate the piezoelectric substrate 28 and the first insulation layer 30 in pieces. The pieces are the devices chips 10 with the first insulation layer 24.

Figure 6A:
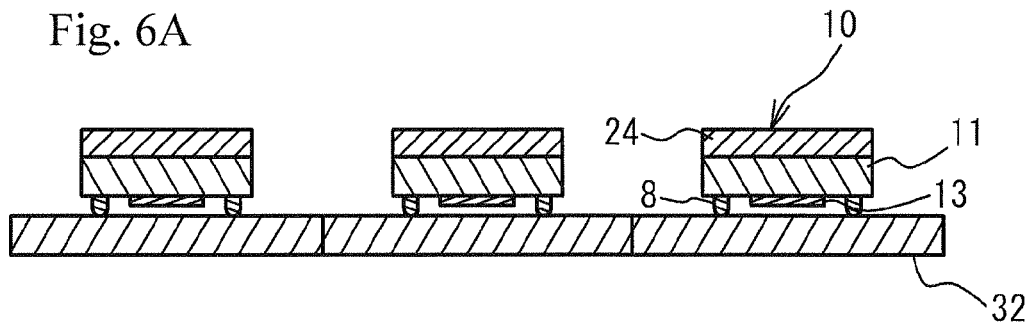
FIGS. 6A through 6D are cross-sectional views illustrating subsequent steps of the method for the fabricating the acoustic wave device in accordance with the first embodiment.
Figure 6B:
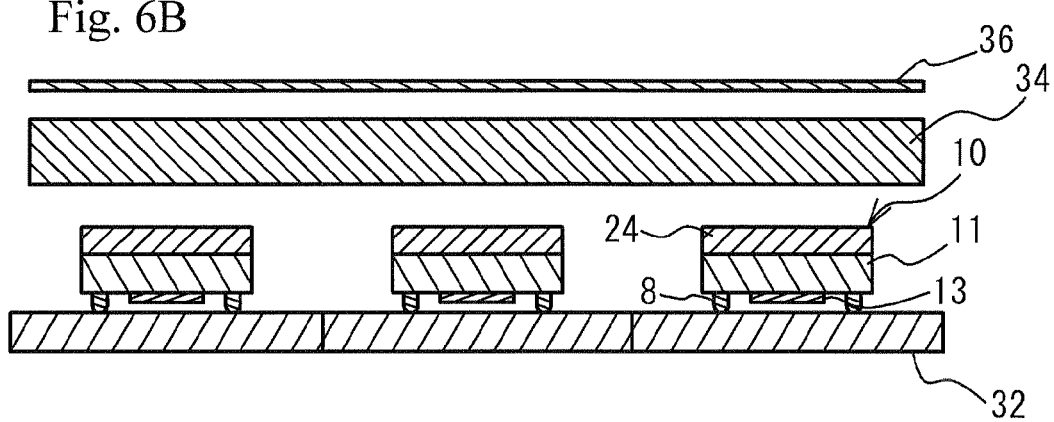

As depicted in FIG. 6A, multiple device chips 10 are flip-chip mounted on the upper surface of the panel substrate 32 by using the bumps 8. Thereafter, as illustrated in FIG. 6B, a solder sheet 34 and a lid 36 are arranged on the substrate 32 and the device chip 10.

Figure 6C:
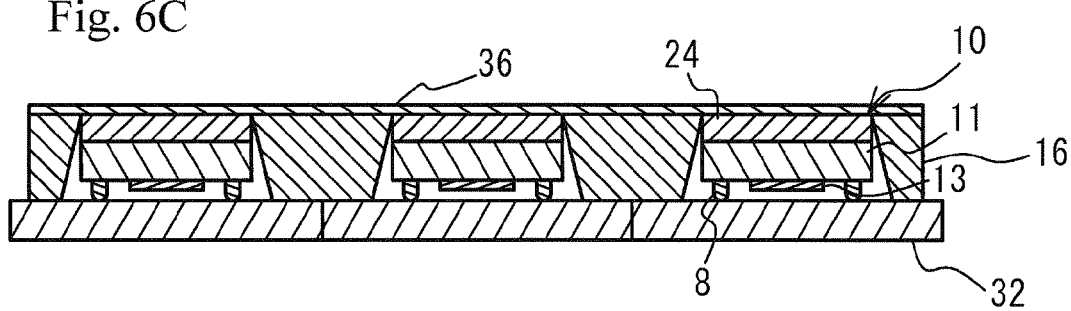

As depicted in FIG. 6C, the solder sheet 34 and the lid 36 are pressurized and heated from the upper side. In this process, since the solder sheet 34 and the lid 36 are heated up to a temperature of about 270° C., the solder sheet 34 is melted and is spread on the metal pattern 20 (not illustrated) on the piezoelectric substrates 11 of the device chips 10. The solder sheet 34 is hardened to make a connection with the metal patterns 20, and the device chips 10 and the first insulation layers 24 are sealed with the metal seal part 16 and the lid 18. The metal seal part 16 does not touch the side surfaces of the device chips 10.

Figure 6D:
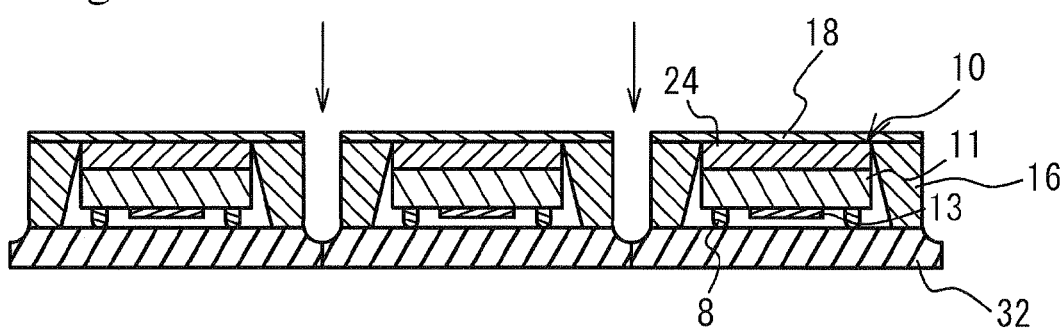

As illustrated in FIG. 6D, the metal seal part 16 and the lid 36 are cut by, for example, dicing. The lids after cutting are also indicated by a reference numeral of 18. The substrate 32 is not cut completely but is cut partly in the depth direction.

Figure 7A:
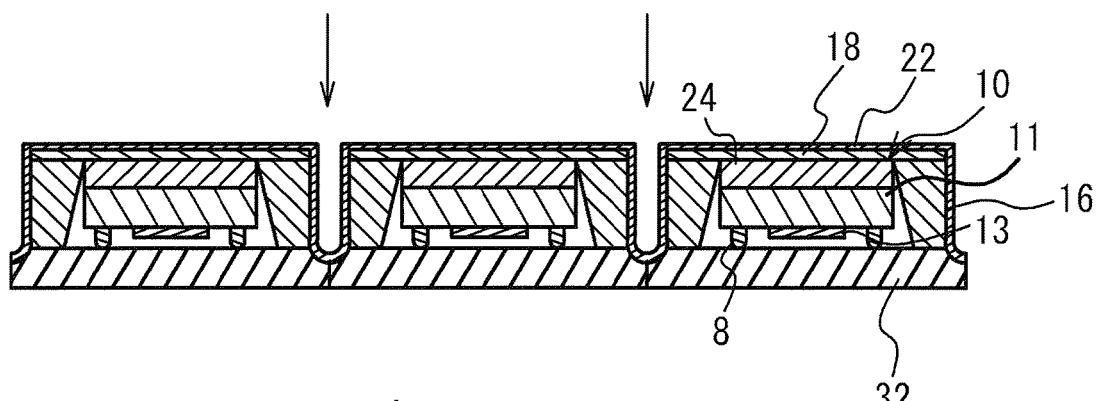
FIGS. 7A and 7B are cross-sectional views illustrating subsequent steps of the method for fabricating the acoustic wave device in accordance with the first embodiment.
Figure 7B:
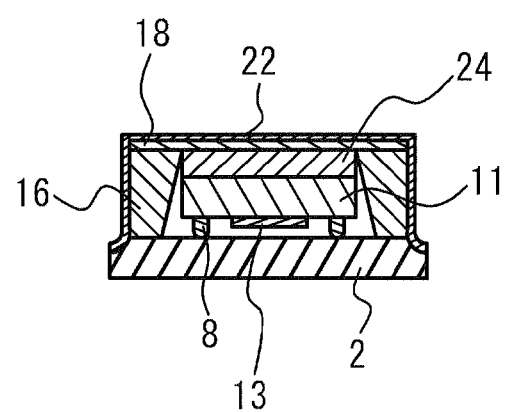

As depicted in FIG. 7A, the protection film 22 made of a metal such as Ni is provided so as to cover the metal seal parts 16 and the lids 18 by, for example, plating. As illustrated in FIG. 7B, the substrate 32 is divided into pieces by, for example, dicing. Thus, the acoustic wave devices of the first embodiments are completed.

Figure 8A:
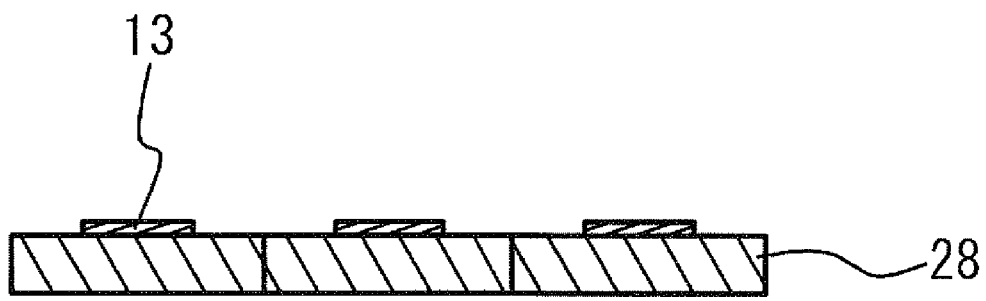
FIGS. 8A and 8B are cross-sectional views illustrating another method for fabricating the acoustic wave device in accordance with the first embodiment.
Figure 8B:
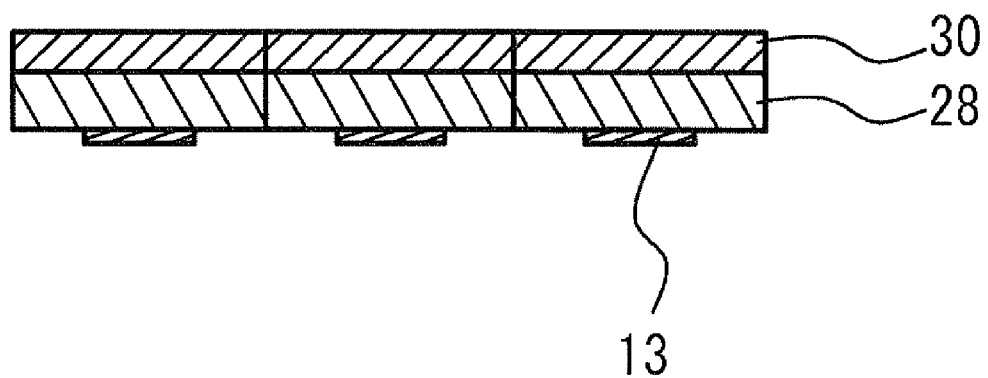

A description will now be given of another method for fabricating the acoustic wave device. FIGS. 8A and 8B are cross-sectional views illustrating anther fabrication method, and FIGS. 9A and 9B are cross-sectional views illustrating yet another fabrication method.

Referring to FIG. 8A, the electrode patterns 13 are provided on the piezoelectric substrate 28. As illustrated in FIG. 8B, the first insulation layer 30 is provided on the surface of the piezoelectric substrate 28 opposite to the surface on which the electrode patterns 13 are provided. Thus, the state illustrated in FIG. 5C is available. Then, steps similar to a series of steps starting from FIG. 5D are carried out, so that the acoustic wave devices of the first embodiment can be completed.

Figure 9A:
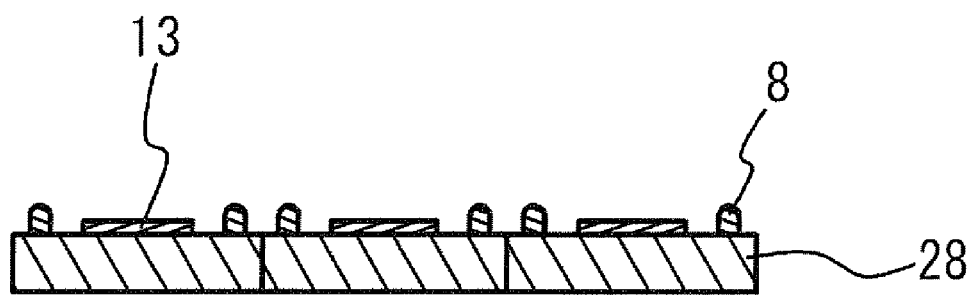
FIGS. 9A and 9B are cross-sectional views illustrating yet another method for fabricating the acoustic wave device in accordance with the first embodiment.
Figure 9B:
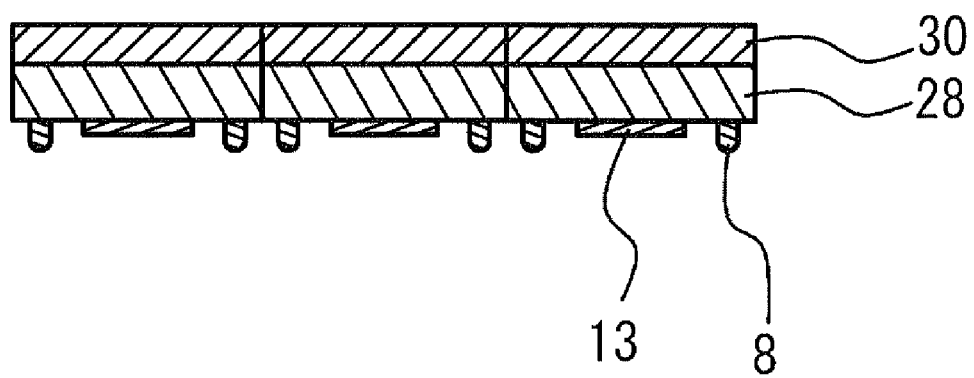

Referring to FIG. 9A, the electrode patterns 13 and the bumps 8 are formed on the piezoelectric substrate 28. Then, as illustrated in FIG. 9B, the first insulation layer 30 is provided on the surface of the piezoelectric substrate 28 opposite to the surface on which the electrode patterns 13 and the bumps 8 are formed. Thus, the state illustrated in FIG. 5D is available. Then, steps similar to a series of steps starting from FIG. 5E are carried out, so that the acoustic wave devices of the first embodiment can be completed.

As illustrated in FIG. 5B and FIGS. 8A through 9B, it is possible to change the order of execution of the steps of forming the electrode patterns 13, those of forming the bumps and those of forming the first insulation layer 30.

Figure 10:
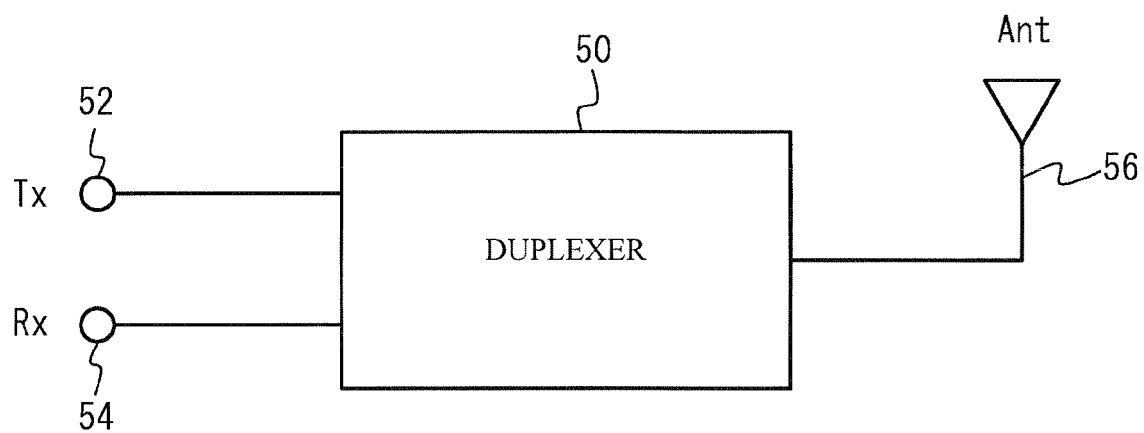
FIG. 10 is a block diagram of a structure used in simulations.

A description will now be given of simulation results of the frequency characteristics of the acoustic wave device depicted in FIG. 1 and that of the first embodiment depicted in FIG. 2. A circuit configuration used in the simulation is described below. FIG. 10 is a block diagram of the above-described circuit configuration.

As depicted in FIG. 10, the acoustic wave device is used as a duplexer 50 suitable for band 1 of W-CDMA (Wideband Code Division Multiple Access). The duplexer 50 is connected to a transmission terminal 52 (Tx), a reception terminal 54 (Rx) and an antenna terminal 56 (Ant). A ladder type filter is employed as the transmission filter, and a resonator and a double mode SAW filter (DMS) are used to form the reception filter.

Parameters used in the simulation are described with reference to FIGS. 2 and 3B. As illustrated in FIG. 2, the piezoelectric substrate of the device chip 10 has a thickness T1 of 180 μm, the first insulation layer 24 has a thickness T2 of 100 μm, and the lid 18 has a thickness T3 of 30 μm. A height H1 from the upper surface of the substrate 2 to the surface of the piezoelectric substrate 11 that faces the substrate 2 is 80 μm. A height H2 from the upper surface of the substrate 2 to the electrode pattern 13 is 79.4 μm. As depicted in FIG. 3B, the device chip 10 has a short-side length L1 of 805 μm, and a long-side length L2 of 1350 μm. The acoustic wave device depicted in FIG. 1 has parameters identical to those described above. The first insulation layer 24 is made of epoxy resin having a dielectric constant of 3.6.

Figure 11A:
FIG. 11A is a graph of results of simulation of pass-band characteristics of acoustic wave devices in accordance with the related art and the first embodiment.
Figure 11B:
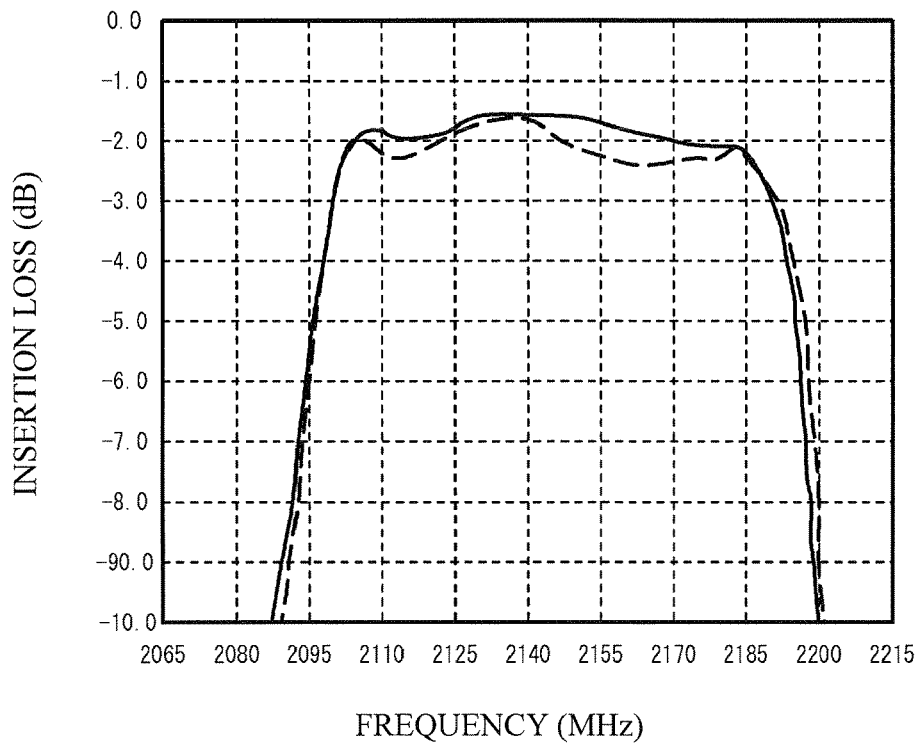
FIG. 11B is an enlarged view of transmission bands.

A description will now be given of the results of simulation of the pass-band characteristics from the transmission terminal 52 to the antenna terminal 56. FIG. 11A illustrates a result of simulation of the pass-band characteristics, and FIG. 11B is an enlarged view of the transmission bands. In each graph, the horizontal axis denotes the frequency (MHz), and the vertical axis denotes the insertion loss (dB). A solid line denotes the results of simulation of the SAW device in accordance with the present embodiment, and a broken line denotes the results of simulation of the SAW device related to the embodiment.

As illustrated in FIGS. 11A and 11B, the first embodiment improves the insertion loss in the transmission band, as compared with the related art. For example, at frequencies of about 1940 MHz, the insertion loss of the related art is approximately −2.5 dB, while the first embodiment is approximately −1.9 dB. As illustrated in FIG. 11A, the first embodiment increases the attenuation at the high-frequency side of the transmission band, as compared with the related art. For example, at frequencies of about 2050 MHz, the related art has an attenuation of around −40.0 dB, while the first embodiment has an attenuation of around −53.0 dB.

Figure 12A:
FIG. 12A is a graph of results of simulation of pass-band characteristics of acoustic wave devices in accordance with the related art and the first embodiment.

A description will now be given of the results of simulation of the pass-band from the antenna terminal 56 to the reception terminal 54. FIG. 12A illustrates a result of simulation of the pass-band characteristics, and FIG. 11 is an enlarged view of the reception bands.

Figure 12B:
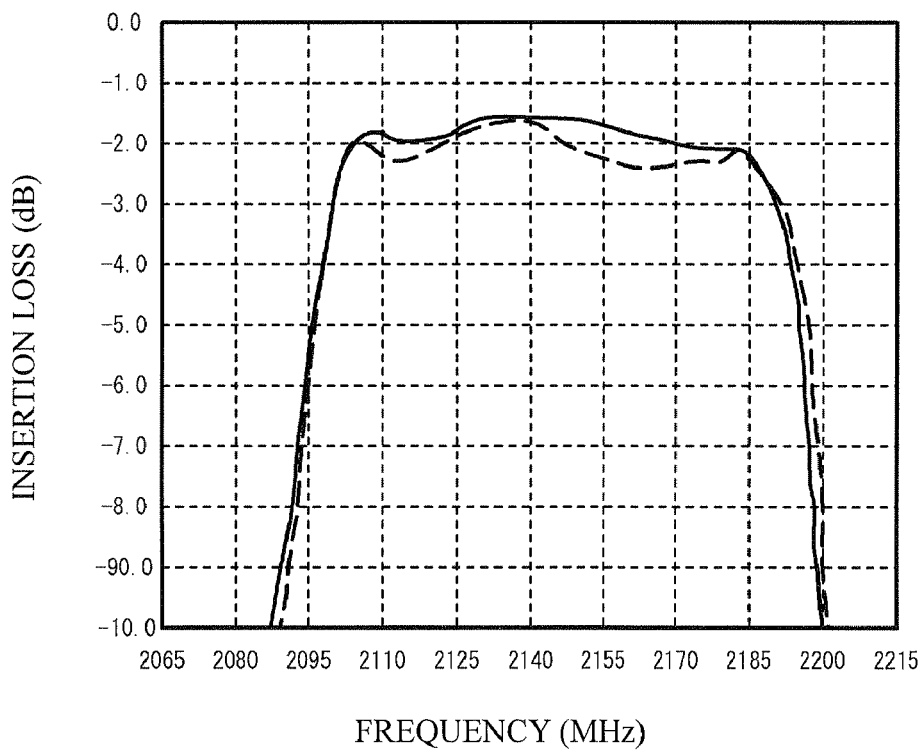
FIG. 12B is an enlarged view of reception bands.

As illustrated in FIGS. 12A and 12B, the first embodiment has a reduced insertion loss, as compared with the related art. For example, at frequencies of about 2155 MHz, the related art has an insertion loss of around −2.2 dB, while the first embodiment has an improved insertion loss of around −1.7 dB. As illustrated in FIG. 12A, the first embodiment has an increased attenuation at the low-frequency side of the reception band, as compared with the related at. For example, at frequencies of about 1930 MHz, the related art has an attenuation of about −48.0 dB, while the first embodiment has an attenuation of around −65.0 dB. According to the first embodiment, the acoustic wave device of the first embodiment has the improved pass-band characteristics.

A description will now be given of the results of simulation of the isolation characteristics and VSWRs (Voltage Standing Wave Ratio). FIG. 13A is a graph of the results of simulation of the isolation characteristics, FIG. 13B is a graph of the results of simulation of VSWRs at the antenna terminal 56, the transmission terminal 52 and the reception terminal 54, and FIG. 13C is a result of simulation of VSWRs at the transmission terminal 52 and the reception terminal 54.

As illustrated in FIG. 13A, the first embodiment has a greater isolation than the related art. For example, at frequencies of about 1930 MHz, the related art has an isolation of around −42.0 dB, while the first embodiment has an isolation of around −68.0 dB.

As illustrated in FIG. 13B, the first embodiment has a VSWR at the antenna terminal 56 closer to 1.0 than that of the related art. For example, at frequencies of about 1950 MHz, the related art has a VSWR of around 1.8, while the first embodiment has a VSWR of around 1.4. At frequencies of about 2150 MHz, the related art has a VSWR of around 2.1 MHz, while the first embodiment has a VSWR of about 1.3.

As illustrated in FIG. 13C, the first embodiment has VSWRs at the transmission terminal 52 and the reception terminal 54 closer to 1.0 than the related art. For example, the related art has a VSWR of around 2.2, while the first embodiment has a VSWR of around 1.6. At frequencies of about 2160 MHz, the related art has a VSWR of 2.2, while the first embodiment has a VSWR of 1.5. As described above, according to the first embodiment, it is possible to improve the VSWR at the antenna terminal 56 and the VSWRs at the transmission terminal 52 and the reception terminal 54, as compared with the related art.

According to the first embodiment, the first insulation layer 24 having a lower dielectric constant than that of the piezoelectric substrate 11 of the device chip 10 is provided on the device chip 10. It is thus possible to suppress the occurrence of the leakage field and suppress increase in the insertion loss of the acoustic wave device in the pass band and degradation of the isolation characteristic. Since the metal seal part 16 does not touch the side surfaces of the device chip 10, it is possible to more reliably prevent the leakage field from being generated. Since the device chip is sealed with the metal seal part 16 and the lid 18, the highly reliable hermetic seal of the acoustic wave device can be realized. According to the first embodiment, it is possible to realize highly reliable hermetic seal of the acoustic wave device and suppress increase in the insertion loss in the pass band and degradation of the isolation characteristic.

In the simulations illustrated in FIG. 11A through FIG. 13C, the first insulation layer 24 is made of epoxy resin. However, the first insulation layer 24 is not limited to epoxy resin but may be made of a material having a relatively low dielectric constant, which may be resin, sapphire, silicon, ceramic or glass. Particularly, epoxy resin has a lower dielectric constant than that of sapphire or ceramic, and is effective for suppression of the leakage of the electric field.

The metal seal part 16 may be made of a metal other than solder. However, the use of solder makes it possible to realize highly reliable seal and electric shield. Further, solder easily realizes the metal seal. Thus, the metal seal part 16 is preferably made of solder.

Second Embodiment

Figure 14:
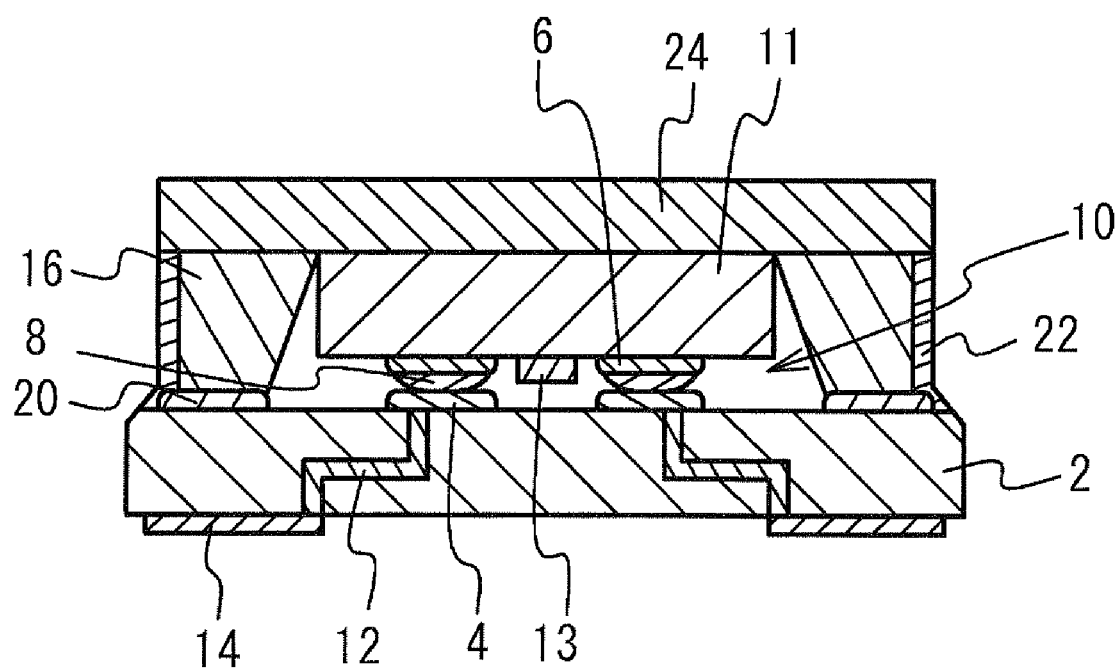
FIG. 14 is a cross-sectional view of an acoustic wave device in accordance with a second embodiment.

A second embodiment is configured to omit the lid 18 and has the device chip 10 sealed with the first insulation layer 24. FIG. 14 is a cross-sectional view of an acoustic wave device in accordance with the second embodiment.

Referring to FIG. 14, the first insulation layer 24 is provided on the surface of the device chip 10 opposite to the other surface that faces the substrate 2. The first insulation layer 24 may be a ceramic cap made of, for example, alumina. That is, the device chip 10 is sealed with the metal seal part 16 and the first insulation layer 24. The metal seal part 16 does not touch the side surfaces of the device chip 10, as in the case of the first embodiment illustrated in FIG. 2.

A method for fabricating the acoustic wave device of the second embodiment is now described. FIG. 15A through FIG. 16B are cross-sectional views illustrating the method for fabricating the acoustic wave device in accordance with the second embodiment. The steps of fabricating the device chip 10 are the same as those illustrated in FIGS. 5A through 5E except that the first insulation layer 30 is not provided. Therefore, the description will start with the step of flip-flop mounting the device chip 10.

Figure 15A:
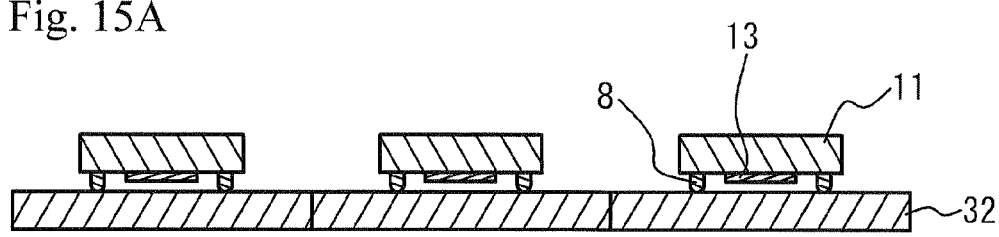
FIGS. 15A through 15D are cross-sectional views illustrating a method for fabricating the acoustic wave device in accordance with the second embodiment.
Figure 15B:
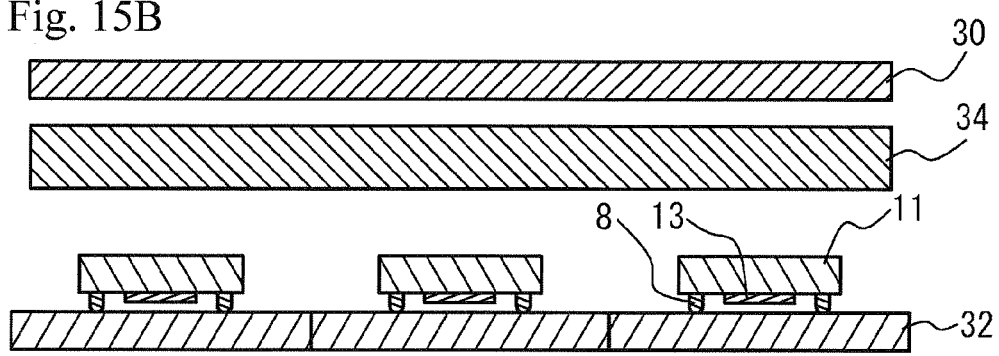

As illustrated in FIG. 15A, a plurality of device chips 10 are flip-chip mounted on an upper surface of a panel substrate 32. Next, as illustrated in FIG. 15B, the solder sheet 34 and the first insulation layer 30 are arranged on the substrate 32 and the device chip 10.

Figure 15C:
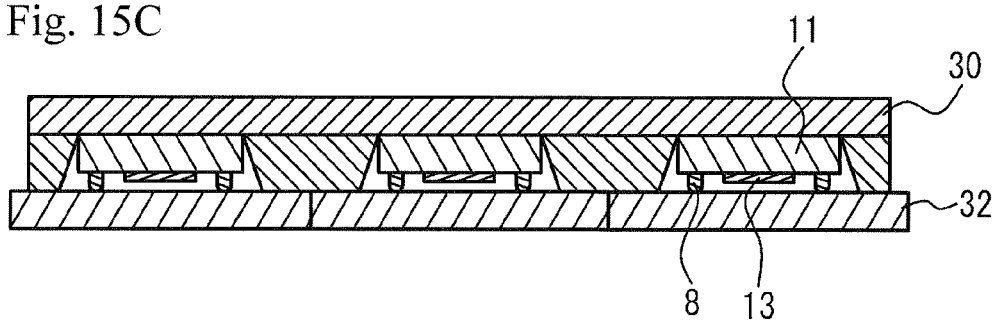

As illustrated in FIG. 15C, the solder sheet 34 and the first insulation layer 30 are pressurized and heated from the upper side. The solder sheet 34 is melted and is connected to the metal pattern 20 provided on the piezoelectric substrates 11 of the device chips 10. Thus, the device chips 10 are sealed with the metal seal parts 16 and the first insulation layer 30. Since the solder sheet 34 and the first insulation layer 30 are pressurized, melted solder is pushed out between the device chips 10 and the first insulation layer 30 and is removed. The metal seal parts 16 do not touch the side surfaces of the device chips 10.

Figure 15D:
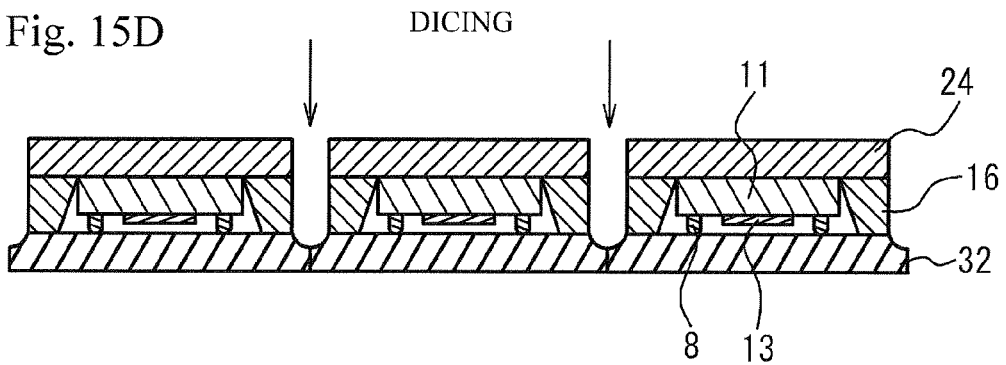

As illustrated in FIG. 15D, the metal seal parts 16 and the first insulation layer 30 are cut by dicing or the like. This cutting divides the first insulation layer 30 into the first insulation layers 24.

Figure 16A:
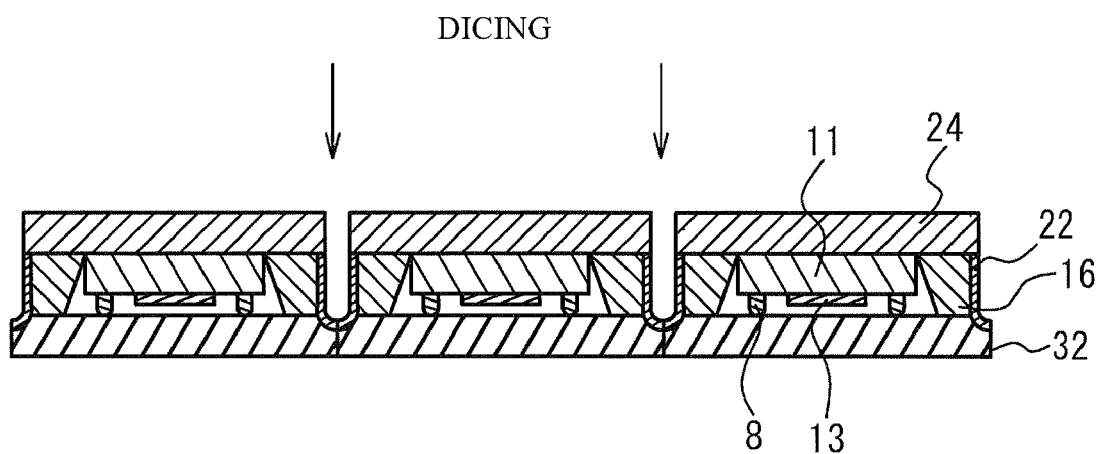
FIGS. 16A and 16B are cross-sectional views of subsequent steps of the method for fabricating the acoustic wave device in accordance with the second embodiment.
Figure 16B:
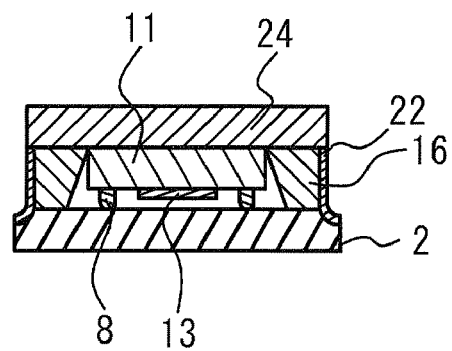

As illustrated in FIG. 16A, the protection film 22 is provided so as to cover the metal seal parts 16 and the first insulation layers 24. As illustrated in FIG. 16B, the substrate 32 is divided into individual pieces. Thus, the acoustic wave devices of the second embodiment are completed.

According to the second embodiment, the first insulation layer 24 having a lower dielectric constant than that of the piezoelectric substrate 11 of the device chip is provided on the device chip 10 as in the case of the first embodiment. Further, the meal seal part 16 does not touch the side surfaces of the device chip 10. It is thus possible to prevent the leakage field from being generated. The device chip 10 is sealed with the first insulation layer 24 and the metal seal part 16. It is thus possible to realize highly reliable hermetic seal of the acoustic wave device and suppress increase in the insertion loss in the pass band and degradation of the isolation characteristic.

Third Embodiment

Figure 17:
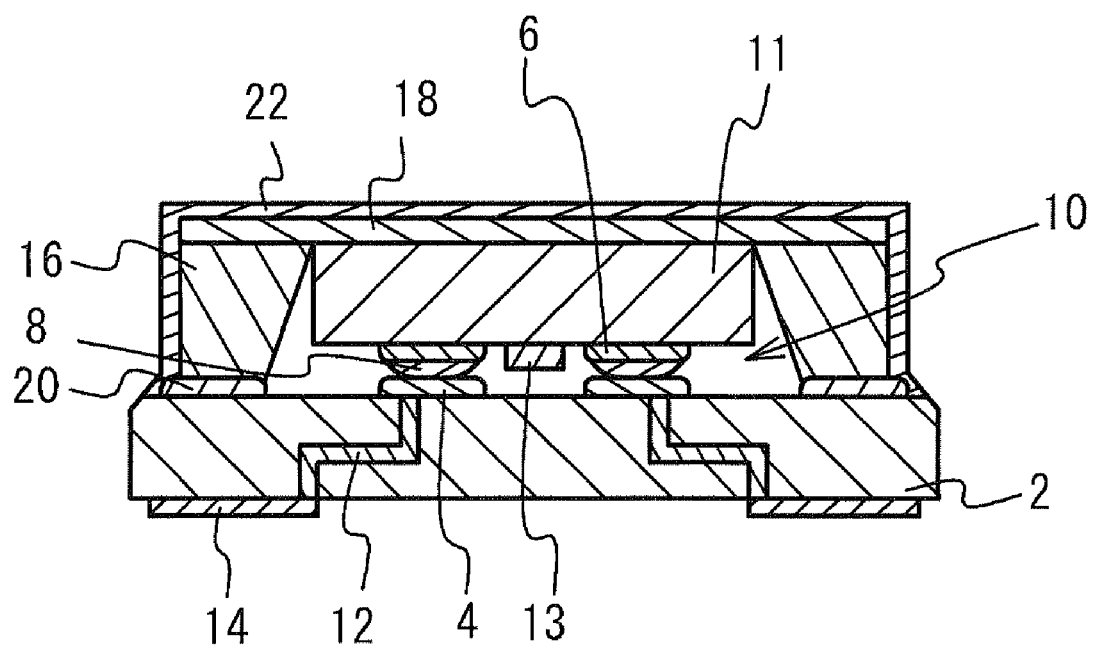
FIG. 17 is a cross-sectional view of an acoustic wave device in accordance with a third embodiment.

A third embodiment does not employ the first insulation layer 24. FIG. 17 is a cross-sectional view of an acoustic wave device in accordance with the third embodiment.

As illustrated in FIG. 17, the device chip 10 is sealed with the metal seal part 16 and the lid 18. The metal seal part 16 does not touch the side surfaces of the device chip 10.

A description will now be given of results of simulation of the frequency characteristics of the acoustic wave device of the related art illustrated in FIG. 1 and that of the third embodiment illustrated in FIG. 17. The circuit configuration used in the simulation is as illustrated in FIG. 10, and the same parameters as those illustrated in FIG. 2 are used.

Figure 18A:
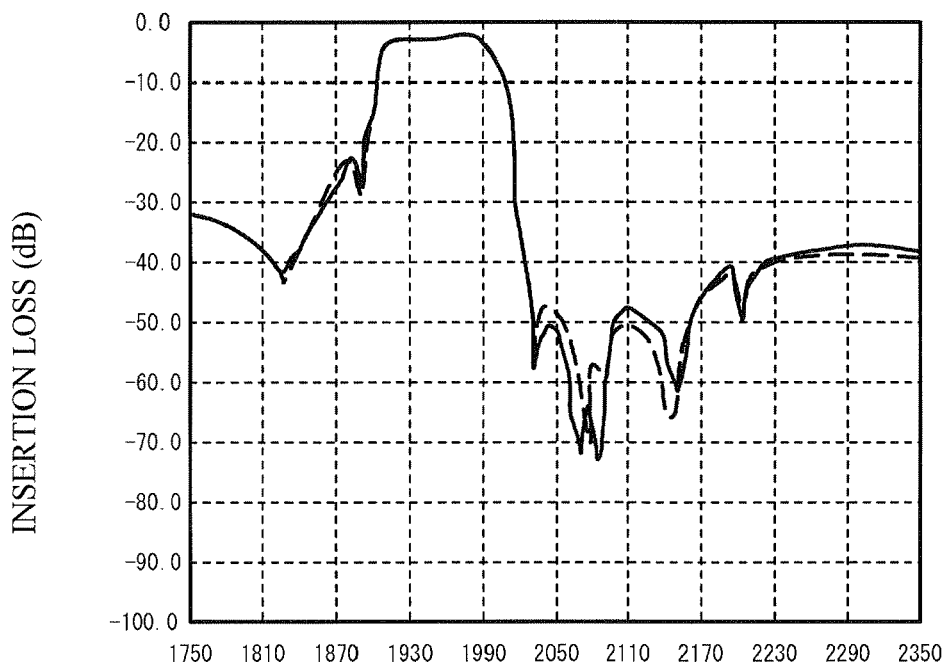
FIG. 18A is a graph of results of simulation of pass-band characteristics of acoustic wave devices in accordance with the related art and a third embodiment.
Figure 18B:
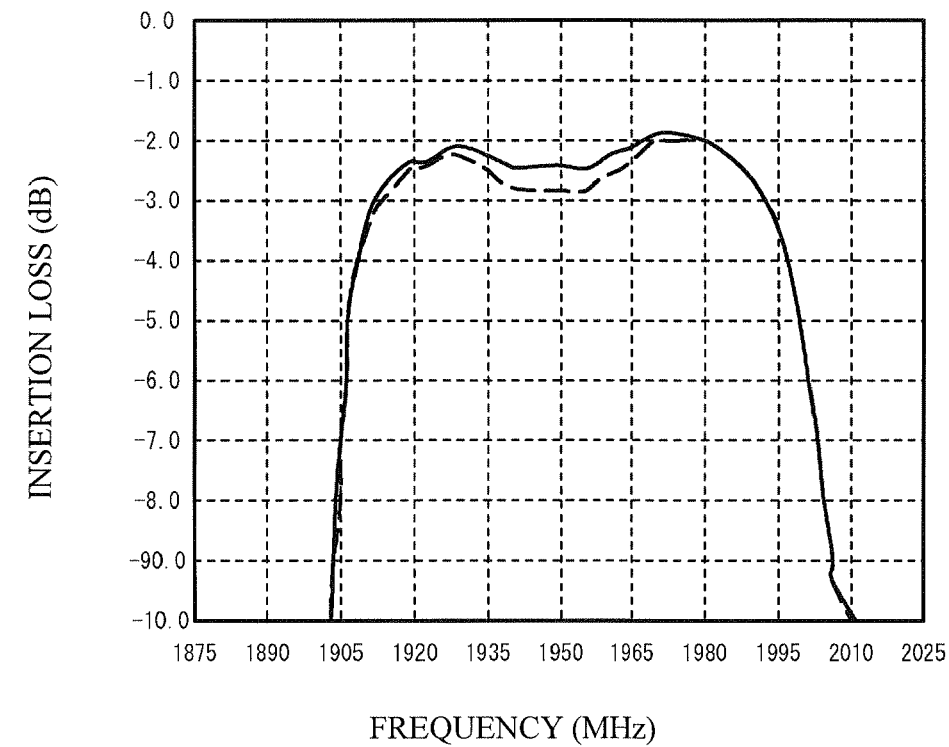
FIG. 18B is an enlarged view of transmission bands.

The results of simulation of the pass-band characteristic from the transmission terminal 52 to the antenna terminal 56 are described below. FIG. 18A is a graph of the results of simulation of the pass-band characteristics, and FIG. 18B is an enlarged view of the transmission bands. A solid line denotes the results of simulation of the SAW device in accordance with the third embodiment, and a broken line denotes the results of simulation of the SAW device of the related art.

As illustrated in FIGS. 18A and 18B, the third embodiment has a reduced insertion loss in the transmission band, as compared with the related art. For example, at frequencies of about 1950 MHz, the related art has an insertion loss of around −2.9 dB, while the third embodiment has an insertion loss of around −2.4 dB. As illustrated in FIG. 18A, the third embodiment has an increased attenuation at the high-frequency side of the transmission band. For example, at frequencies of about 2080 MHz, the related art has an attenuation of around −58 dB, while the third embodiment has an attenuation of around −72.0 dB.

Figure 19A:
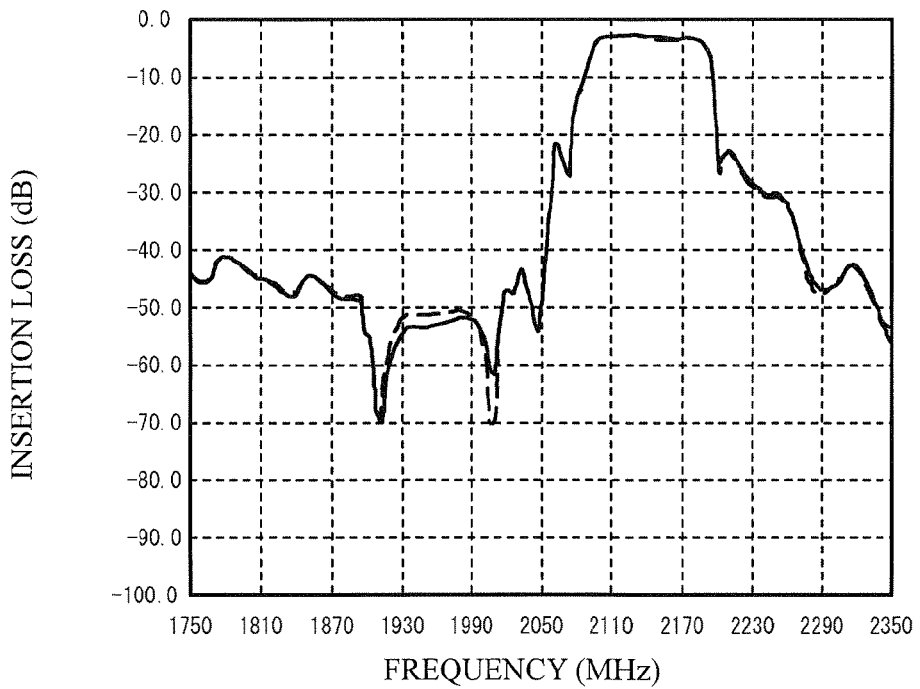
FIG. 19A is a graph of results of simulation of pass-band characteristics of acoustic wave devices in accordance with the related art and the third embodiment.

The results of simulation of the pass-band characteristics from the antenna terminal 56 to the reception terminal 54 are now described. FIG. 19A is a graph of results of simulation of the pass-band characteristics, and FIG. 19B is an enlarged view of the reception bands.

Figure 19B:
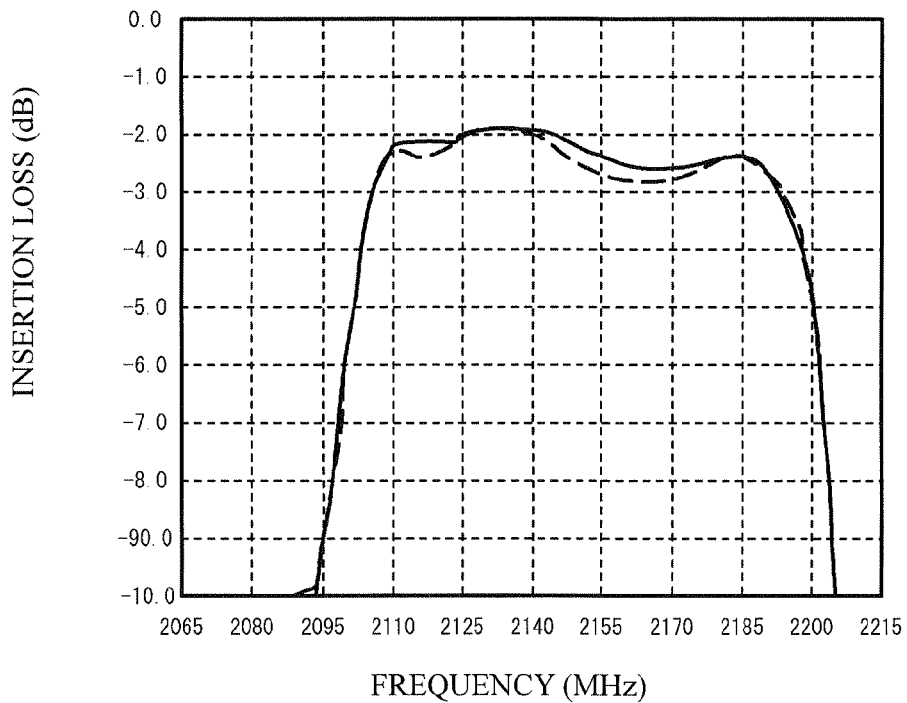
FIG. 19B is an enlarged view of reception bands.

As illustrated in FIGS. 19A and 19B, the third embodiment has a less insertion loss in the reception band than that of the related art. For example, at frequencies of about 2155 MHz, the related art has an insertion loss of −2.8 dB, while the third embodiment has an insertion loss of −2.4 dB. As illustrated in FIG. 19A, the third embodiment has a greater attenuation at the low-frequency side of the reception band than that of the related art. For example, at frequencies of about 1903 MHz, the related art has an attenuation of −51.0 dB, while the third embodiment has an attenuation of −54.0 dB. According to the third embodiment, the pass-band characteristic of the third embodiment is improved, as compared with the related art.

Figure 20A:
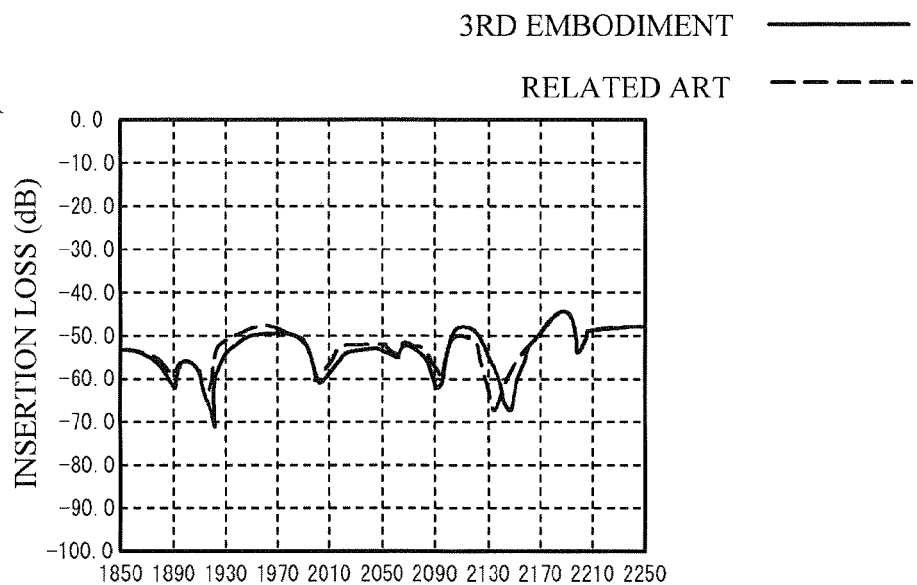
FIG. 20A is a graph of results of simulation of isolation characteristics of the related art and the third embodiment.
Figure 20B:
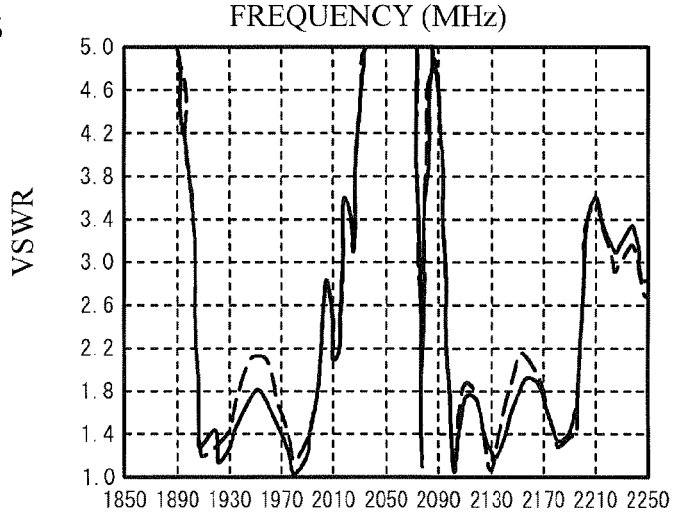
FIG. 20B is a graph of results of simulation of VSWR at an antenna.
Figure 20C:
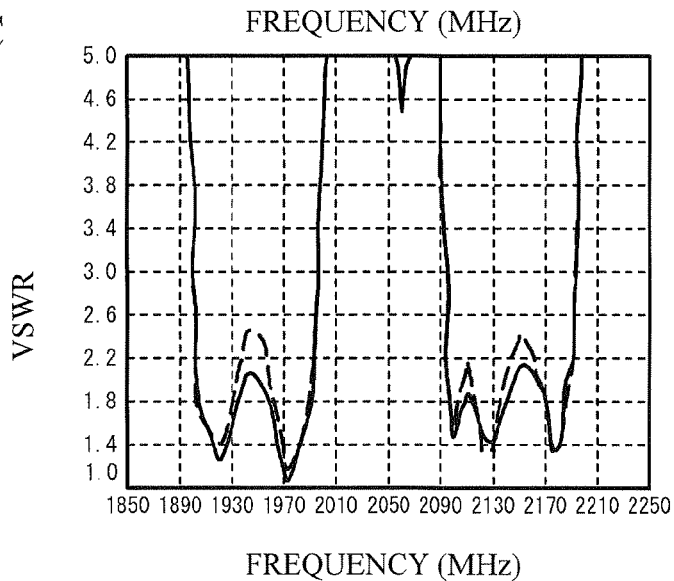
FIG. 20C is a graph of results of simulation of VSWRs at a transmission terminal and a reception terminal.

The results of simulation of the isolation characteristics and VSWRs are now described. FIG. 20A is a graph of the results of simulation of the isolation characteristics, and FIG. 20B is a graph of the results of simulation of VSWRs. FIG. 20C is a graph of the results of simulation of VSWRs at the transmission terminal 52 and the reception terminals 54.

As depicted in FIG. 20A, the third embodiment has improved isolation, as compared with the related art. For example, at frequencies of about 1930 MHz, the related art has an isolation of −50.0 dB, while the third embodiment has an isolation of −54.0 dB.

As illustrated in FIG. 20B, the third embodiment has a VSWR at the antenna terminal 56 closer to 1.0. For example, at frequencies of about 1950 MHz, the related art has a VSWR of around 2.2, while the third embodiment has a VSWR of around 1.8. At frequencies of about 2150 MHz, the related art has a VSWR of around 2.2, while the third embodiment has a VSWR of around 1.9.

As illustrated in FIG. 20C, the third embodiment has VSWRs at the transmission terminal 52 and the reception terminal 54 closer to 1.0. For example, at frequencies of about 1950 MHz, the related art has a VSWR of around 2.4, while the third embodiment has a VSWR of around 2.0. At frequencies of 2150 MHz, the related art has a VSWR of around 2.4, while the third embodiment has a VSWR of around 2.1. According to the third embodiment, it is possible to improve the VSWR at the antenna terminal 56 and the VSWRs of the transmission terminal 52 and the reception terminal 54, as compared with the third embodiment.

According to the third embodiment, the metal seal part 16 does not touch the side surfaces of the device chip 10, so that the leakage field can be prevented from being generated. The device chip 10 is sealed with the metal seal part 16 and the lid 18. It is thus possible to realize highly reliable hermetic seal of the acoustic wave device and suppress increase in the insertion loss in the pass band and degradation of the isolation characteristic.

The device chip 10 is not limited to the SAW device chip but may be a boundary acoustic wave device chip. That is, the acoustic wave device may be a SAW device or a boundary acoustic wave device.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various change, substitutions, and alterations could be made hereto without departing from the spirit and scope of the invention.

What is claimed is:

1. An acoustic wave device comprising:
a substrate;
a device chip that has a piezoelectric substrate and is flip-chip mounted on a surface of the substrate;
a first insulation layer that has a dielectric constant lower than that of the piezoelectric substrate and is provided on a surface of the device chip opposite to another surface that faces the substrate; and
a metal seal part that seals the device chip,
wherein the first insulation layer does not touch any side surfaces of the device chip and the metal seal part surrounds the side surfaces of the device chip.

2. The acoustic wave device according to claim 1, wherein the metal seal part does not touch any of the side surfaces of the device chip.

3. The acoustic wave device according to claim 1, further comprising a metal pattern that is provided on the surface of the substrate and is located further out than a region in which the device chip overlaps the substrate, wherein the metal pattern is connected to the metal seal part.

4. The acoustic wave device according to claim 3, further comprising a second insulation layer that is provided on the surface of the substrate and is provided in at least a part of an area between the region and the metal pattern.

5. The acoustic wave device according to claim 4, further comprising an interconnection pattern that is provided on the surface of the substrate and is connected to the device chip and the metal pattern, wherein the second insulation layer is provided so as to overlap at least a part of the metal pattern.

6. The acoustic wave device according to claim 1, wherein the first insulation layer comprises one of resin, sapphire, silicon, ceramic and glass.

7. The acoustic wave device according to claim 1, wherein the first insulation layer comprises epoxy resin.

8. The acoustic wave device according to claim 1, wherein the metal seal resin comprises solder.

9. An acoustic wave device comprising:
a substrate;
a device chip that has a piezoelectric substrate and is flip-chip mounted on an a surface of the substrate; and
a metal seal part that seals the device chip and does not touch any side surfaces of the device chip,
wherein the metal seal part surrounds the side surfaces of the device chip and a void is formed between the side surface of the device chip and the metal seal part.

10. The acoustic wave device according to claim 9, wherein the metal seal resin comprises solder.

11. An acoustic wave device comprising:
a substrate;
a device chip that has a piezoelectric substrate and is flip-chip mounted on a surface of the substrate;
a metal seal part that seals the device chip and does not touch any side surfaces of the device chip;
a metal pattern that is provided on the surface of the substrate and is located further out than a region in which the device chip overlaps the substrate; and
an insulation layer that is provided on the surface of the substrate and is provided in at least a part of an area between the region and the metal pattern,
wherein the metal seal part surrounds the side surface of the device chip and the metal pattern is connected to the metal seal part.

12. The acoustic wave device according to claim 11, further comprising an interconnection pattern that is provided on the surface of the substrate and is connected to the device chip and the metal pattern, wherein the insulation layer is provided so as to overlap at least a part of the metal pattern.

13. A method for fabricating an acoustic wave device comprising:
flip-chip mounting a device chip having a piezoelectric substrate on a surface of a substrate;
providing a first insulation layer on a surface of the device chip opposite to another surface that faces the substrate, the first insulation layer having a dielectric constant smaller than that of the piezoelectric substrate, and wherein the first insulation layer does not touch any side surfaces of the device chip; and
sealing the device chip with a metal seal part that is provided on the surface of the substrate and is located further out than a region in which the device chip overlaps the substrate, the metal pattern being connected to the metal seal part,
wherein the metal seal part does not touch any of the side surfaces of the device chip and surrounds the side surfaces of the device chip.

14. The method according to claim 13, wherein the providing the first insulation layer leads to the flip-chip mounting.

15. The method according to claim 13, wherein the providing the first insulation layer includes the sealing the device chip with the metal seal part.

* * * * *